United States Patent
Ahmed et al.

(10) Patent No.: US 9,234,291 B2
(45) Date of Patent: Jan. 12, 2016

(54) ZINC THIN FILMS PLATING CHEMISTRY AND METHODS

(75) Inventors: Shafaat Ahmed, Yorktown Heights, NY (US); Hariklia Deligianni, Tenafly, NJ (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 398 days.

(21) Appl. No.: 12/878,787

(22) Filed: Sep. 9, 2010

(65) Prior Publication Data

US 2012/0061250 A1 Mar. 15, 2012

(51) Int. Cl.
| | |
|---|---|
| *C25D 3/22* | (2006.01) |
| *C25D 5/48* | (2006.01) |
| *C25D 15/02* | (2006.01) |
| *H01L 21/02* | (2006.01) |
| *H01L 31/032* | (2006.01) |
| *H01L 31/072* | (2012.01) |
| *C25D 5/50* | (2006.01) |

(52) U.S. Cl.
CPC .. *C25D 3/22* (2013.01); *C25D 5/48* (2013.01); *C25D 15/02* (2013.01); *H01L 21/02568* (2013.01); *H01L 21/02628* (2013.01); *H01L 31/0326* (2013.01); *H01L 31/072* (2013.01); *C25D 5/50* (2013.01); *Y02E 10/50* (2013.01)

(58) Field of Classification Search
CPC ............ C25D 3/22–3/24; C25D 3/565; H01L 21/02104–21/02697
USPC ............. 205/99–101, 305–314, 155; 423/101
See application file for complete search history.

(56) References Cited

U.S. PATENT DOCUMENTS

| | | | | |
|---|---|---|---|---|
| 2,080,479 | A | * | 5/1937 | Hoff .............................. 205/306 |
| 2,828,252 | A | | 3/1958 | Fischer |
| 2,859,159 | A | * | 11/1958 | Wernlund ...................... 205/239 |
| 3,730,855 | A | | 5/1973 | Poor et al. |
| 3,856,637 | A | | 12/1974 | Kessler et al. |
| 4,488,942 | A | * | 12/1984 | Martin et al. .................. 205/245 |
| 4,904,354 | A | * | 2/1990 | Stavitsky et al. .............. 205/176 |
| 5,198,095 | A | * | 3/1993 | Urakawa et al. ............... 205/138 |
| 5,215,631 | A | * | 6/1993 | Westfall ......................... 205/351 |
| 5,695,627 | A | * | 12/1997 | Nakazawa et al. ............. 205/227 |
| 6,409,907 | B1 | * | 6/2002 | Braun et al. ................... 205/317 |

(Continued)

OTHER PUBLICATIONS

Petrik Laboratories, Inc., Acid/Base pKa Values (2008), http://web.archive.org/web/20080926043537/http://www.petrik.com/PUBLIC/library/misc/acid_base_pk.htm.*

(Continued)

*Primary Examiner* — James Lin
*Assistant Examiner* — Ho-Sung Chung
(74) *Attorney, Agent, or Firm* — Anthony Canale; Andrew M. Calderon; Roberts, Mlotkowski, Safran & Cole PC (57) ABSTRACT

Techniques for electrodepositing zinc (Zn)-containing films are provided. In one aspect, a method of preparing a Zn electroplating solution is provided. The method includes the following steps. The solution is formed from a mixture of at least one zinc salt, a sulfonic acid and a solvent. The sulfonic acid is quenched with a base. A pH of the solution is adjusted to be either less than about 3.5 or greater than about 8.0. The pH of the solution can be adjusted by adding additional sulfonic acid to the solution to adjust the pH of the solution to be less than about 3.5 or by adding a second base to the solution to adjust the pH of the solution to be greater than about 8.0. A Zn electroplating solution and an electroplating method are also provided.

16 Claims, 11 Drawing Sheets

(56) References Cited

U.S. PATENT DOCUMENTS

| | | | |
|---|---|---|---|
| 6,585,812 B2 | 7/2003 | Martyak et al. | |
| 6,653,701 B1 | 11/2003 | Yamazaki et al. | |
| 6,811,673 B2 | 11/2004 | Brodt et al. | |
| 2005/0189231 A1* | 9/2005 | Capper et al. | 205/246 |
| 2005/0208386 A1* | 9/2005 | Clarke | 429/347 |
| 2009/0205714 A1* | 8/2009 | Kuhnlein et al. | 136/264 |
| 2009/0321268 A1 | 12/2009 | Nakashima et al. | |

OTHER PUBLICATIONS

Hill et al., Chemistry in Context (2000).*

J.J. Scragg et al, "Synthesis and Characterization of Cu2ZnSnS4 Absorber Layers by an Electrodeposition-Annealing Route," Thin Solid Films, 517(7), pp. 2481-2484 (2009).

T.K. Todorov et al., "High-Efficiency Solar Cell with Earth-Abundant Liquid-Processed Absorber," Advanced Materials, 22, 1-4 (2010).

Gernon et al., "Environmental Benefits of Methanesulfonic Acid: Comparative Properties and Advantages," Green Chemistry, pp. 127-140 (Jun. 1999).

Mahalingam et al., "Studies of Electrosynthesized Zinc Selenide Thin Films," Journal of New Materials for Electrochemical Systems, vol. 10, pp. 15-19 (2007).

R.M. Fisher et al., "Accelerated Growth of Tin Whiskers," Acta Metallurgica, vol. 2, pp. 368-373 (1954).

M. Kurihara et al., "Kesterite Absorber Layer Uniformity From Electrodeposited Pre-Cursors," Phys. Status Solidi, C6 (5) 1241-1244 (2009).

M. Li et al., "Effect of Additives on Electrodeposition of Nanocrystalline Zinc from Acidic Sulfate Solutions," J. Electrochem. Soc., 154 (11), D567-D571 (2007).

D. Lohman, "Zinc Whisker contamination," HP Services.

M.S. Pereira et al., "The Influence of Sorbitol on Zinc Film Deposition, Zinc Dissolution Process and Morphology of Deposits Obtained from Alkaline Bath" J. Appl. Electrochem., 36, 727-732 (2006).

* cited by examiner

$ Zn(002)   # Zn(100)   @ CuZn5   % Cu(111)   * Zn(102)
& Zn(004)   α Zn(112)   β Zn(104)   η Zn(202)

FIG. 11

$ Zn(002)   # Zn(100)   @ CuZn5   % Cu(111)   * Zn(102)
& Zn(004)   α Zn(112)   β Zn(104)   η Zn(202)

FIG. 12
1200

|—1 μm—|
Mag = 20.00 K X   Time: 15:33:35   Date: 15 Mar 2010
WD = 3.4 mm       EHT = 5.00 kV    File Name = Zn_35J_ann150C 1hr08.tif

FIG. 13
1300

|—1 μm—|
Mag = 20.00 K X   Time: 16:13:58   Date: 15 Mar 2010
WD = 3.4 mm       EHT = 5.00 kV    File Name = Zn_35J500TU_ann150C 1hr26.tif

| 1 μm |

Mag = 20.00 K X  Time: 9:55:41  Date: 2 Jun 2010
WD = 1.6 mm   EHT = 5.00 kV  File Name = ZnBi1000_526201004.tif

FIG. 18B
1800B

200nm  Mag = 54.71 K X  Time: 15:22:12  Date: 1 Jun 2010
       WD = 2.7 mm     EHT = 5.00 kV    File Name = ZnBi1k526201009.tif

ZINC THIN FILMS PLATING CHEMISTRY AND METHODS

FIELD OF THE INVENTION

The present invention relates to electrodeposition and more particularly, to techniques for electrodepositing zinc (Zn)-containing films.

BACKGROUND OF THE INVENTION

There is an increased demand for chalcogenide materials containing copper (Cu), zinc (Zn), tin (Sn), sulfur (S) and/or selenium (Se), such as $Cu_2ZnSn(S/Se)_4$ (CZTS), for use as absorber layers in solar cells. In order to fabricate CZTS absorber layers for next generation low cost solar cells, the production of whisker and dendrite free controlled thin films of Zn will be required. A whisker, for example, is a protrusion of a metal bar or needle which is usually submicrometer to a few micrometers in length, and which causes shorting in the device. See, for example, J. J. Scragg et al, "Synthesis and Characterization of $Cu_2ZnSnS_4$ Absorber Layers by an Electrodeposition-Annealing Route," Thin Solid Films, 517(7), pgs. 2481-2484 (2009), M. Kurihara et al., "Kesterite Absorber Layer Uniformity From Electrodeposited Pre-Cursors," Phys. Status Solidi, C6 (5) 1241-1244 (2009) and T. K. Todorov et al., "High-Efficiency Solar Cell with Earth-Abundant Liquid-Processed Absorber," Advanced Materials, 22, 1-4 (2010). In addition, controlled Zn thin films will be in high demand for applications such as corrosion resistance layers on ferrous materials, as well as on decorative parts, electronic materials and automotive parts. See, for example, M. S. Pereira et al., "The Influence of Sorbitol on Zinc Film Deposition, Zinc Dissolution Process and Morphology of Deposits Obtained from Alkaline Bath" J. Appl. Electrochem., 36, 727-732 (2006) and M. Li et al., "Effect of Additives on Electrodeposition of Nanocrystalline Zinc from Acidic Sulfate Solutions," J. Electrochem. Soc., 154 (11), D567-D571 (2007).

Many current Zn thin film plating techniques, however, require high plating temperatures and contain very toxic materials like cyanide and ammonium, or use an alkaline solution which is a potential source of oxygen as an impurity in the deposit. Other Zn thin film plating techniques have low plating efficiency or use an acidic bath that is only for Zn-alloys with metals such as nickel (Ni) and others. Commercial galvanizing methods are mainly applied for thick layers of Zn deposit and are not suitable for thin film fabrication.

Therefore, improved techniques for controlled Zn thin film plating would be desirable.

SUMMARY OF THE INVENTION

The present invention provides techniques for electrodepositing zinc (Zn)-containing films. In one aspect of the invention, a method of preparing a Zn electroplating solution is provided. The method includes the following steps. The solution is formed from a mixture of at least one zinc salt, a sulfonic acid and a solvent. The sulfonic acid is quenched with a base. A pH of the solution is adjusted to be either less than about 3.5 or greater than about 8.0. The pH of the solution can be adjusted by adding additional sulfonic acid to the solution to adjust the pH of the solution to be less than about 3.5 or by adding a second base to the solution to adjust the pH of the solution to be greater than about 8.0.

In another aspect of the invention, a Zn electroplating solution is provided. The solution includes at least one zinc salt; a sulfonic acid; a solvent; and at least one base, wherein a pH of the solution is either less than about 3.5 or greater than about 8.0.

In yet another aspect of the invention, an electroplating method is provided. The method includes the following steps. A Zn electroplating solution is prepared by the steps of: forming the solution from a mixture of at least one zinc salt, a sulfonic acid and a solvent; quenching the sulfonic acid with a base; and adjusting a pH of the solution to be either less than about 3.5 or greater than about 8.0. A substrate is provided. A Zn-containing film is electroplated on the substrate using the solution as a plating bath.

A more complete understanding of the present invention, as well as further features and advantages of the present invention, will be obtained by reference to the following detailed description and drawings.

DETAILED DESCRIPTION OF PREFERRED EMBODIMENTS

Figure 1:
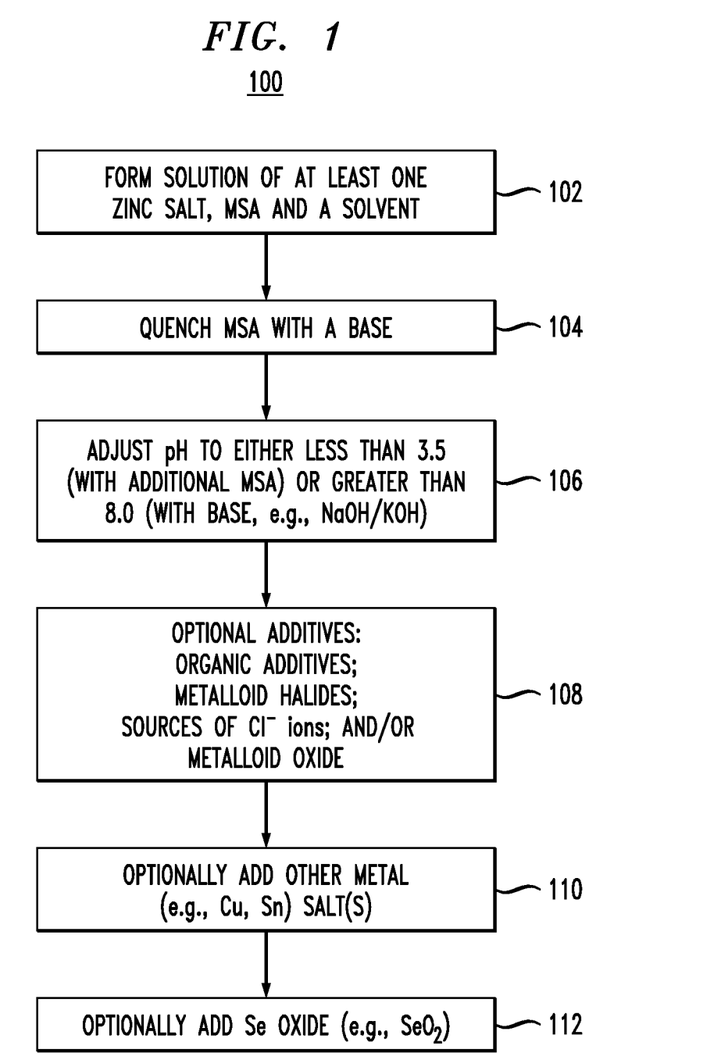
FIG. 1 is a diagram illustrating an exemplary methodology for preparing a zinc (Zn) electroplating solution according to an embodiment of the present invention.

Provided herein are techniques for electroplating Zinc (Zn) thin films with a uniform microstructure and high plating efficiency. FIG. 1, for example, is a diagram illustrating exemplary methodology 100 for preparing a Zn electroplating solution. The terms "electroplating" and "electrodepositing" will be used interchangeably herein. In step 102, the solution is formed from a mixture of at least one Zn salt, a sulfonic acid, such as methanesulfonic acid (MSA), and a solvent. Suitable zinc salts include, but are not limited to, zinc chloride ($ZnCl_2$), zinc nitrate ($Zn(NO_3)_2$), zinc sulfate ($ZnSO_4$) and mixtures thereof. According to an exemplary embodiment, the solution contains from about 0.1 molar (M) to about 0.5M zinc salt in from about 0.05M to about 1M MSA. Suitable solvents include, but are not limited to, water.

At this point, the solution will have a pH in the range of from about 0 to about 0.1. To better control the microstructure and to increase plating efficiency, in step 104, the sulfonic acid, e.g., MSA, is quenched with a base. A suitable base includes, but is not limited to, sodium hydroxide (NaOH). This quenching step will bring the pH of the solution to from about 6.5 to about 7.5.

Next, in step 106, the pH of the solution is adjusted to be either less than about 3.5 or greater than about 8.0. As will be described in detail below, using the electroplating solution adjusted to one of these pH ranges will greatly enhance the plating process, i.e., resulting in 100% plating efficiency, or even higher.

The pH can be adjusted in one of two ways depending on the desired result (i.e., acidic or basic). According to one exemplary embodiment, wherein a pH of less than about 3.5 is desired, step 106 includes adding additional sulfonic acid (e.g., additional MSA) to reduce the pH of the solution to less than about 3.5. According to another exemplary embodiment, wherein a pH of greater than about 8.0 is desired, step 106 includes adding a second base(s) (e.g., a combination of NaOH and potassium hydroxide (KOH)) to increase the pH of the solution to greater than about 8.0. Without being bound by any theory, it is thought that by way of this quenching and pH readjusting process, the sulfonic acid (e.g., MSA) forms a complex with the metal ions in this case $Zn^{+2}$ and helps plating by suppressing the hydrogen evolution. Either the acidic (pH of less than about 3.5) or basic (pH of greater than about 8.0) solution configurations will exhibit high plating efficiency and will yield Zn thin films with a controlled microstructure. The choice of the acidic or basic solution then depends on the particular application. For example, in certain situations corrosion of the substrate might be a concern with an acidic solution, so the basic solution is chosen. Alternatively, in other instances a basic solution might lead to undesirable oxidation of the substrate. This is the case, for example, with molybdenum (Mo)-coated substrates. In that instance, the acidic solution might be preferable. The acidic Zn plating solution has the added benefit of a lower oxygen impurity concentration (see below).

According to an exemplary embodiment, one liter (L) of the Zn electroplating solution is prepared by placing from about 200 milliliters (ml) to about 400 ml of de-ionized water in a flask. A measured amount of Zn salt is added to the flask. MSA at a concentration of greater than or equal to about 0.5M is added to the flask. After stirring, the zinc salt dissolves and the solution becomes colorless (pH is from about 0 to about 0.1). The solution is then quenched by instantly adding NaOH at a concentration of greater than or equal to about 0.5M (pH is now from about 6 to about 7). The solution becomes very milky and viscous due to the precipitation of ZnO/ZnOH. To attain an acidic solution, MSA is slowly added to bring the solution pH to about 2.0, where the solution becomes clear. De-ionized water is then added to bring the total volume to 1 L. Alternatively, to attain a basic solution, NaOH or KOH are slowly added to bring the solution pH to greater than or equal to about 8.0, where the solution becomes clear. De-ionized water is then added to bring the total volume to 1 L.

Advantageously, the present electroplating solutions do not contain any harmful chemicals like cyanide or ammonium (see, for example, U.S. Pat. No. 3,856,637 issued to Kessler et al., U.S. Pat. No. 2,828,252 issued to Fischer et al, and U.S. Pat. No. 3,730,855 issued to Poor et al.) and thus can be easily adopted in an industrial environment. The acid in this Zn plating bath (i.e., MSA) is biodegradable and plating can be conducted at room temperature. Therefore the chemistry is environmentally friendly. The Zn electroplated thin films obtained by the present techniques have very large grain sizes and thus can also be useful in electronic component applications (e.g., microelectronics). Further, the present electroplating solutions yield grains with a preferred (002) orientation (see below).

As will be described in detail below, the present Zn electroplating solutions are formulated to control hydrogen evolution and achieve a very high plating efficiency. This process can be worked on a wide acidic or basic pH range. Since the plating can be done from acidic solutions (pH of less than about 3.5), the Zn thin films produced will have a low concentration of oxygen as an impurity which is beneficial for $Cu_2ZnSn(S/Se)_4$ (CZTS) absorber layer fabrication since oxygen impurities degrade solar cell efficiency. The deposited film is dendrite and whisker free and the film microstructure is very uniform and the grain structure and orientation may be controlled with the use of additives, as described below. For a discussion of dendrite and whisker contamination see, for example, D. Lohman, "Zinc Whisker contamination," HP Services and R. M. Fisher et al., "Accelerated Growth of Tin Whiskers," Acta Metallurgica, vol. 2, pgs. 368-373 (1954), the contents of each of the foregoing are incorporated by reference herein.

Advantageously, the electroplating solution does not contain any complexing agents. Complexing agents introduce impurities into the deposited film. Furthermore, complexing agents oxidize and are difficult to maintain in a plating bath.

Optionally, in step 108, one or more additives may be added to the solution. These additives can include one or more organic additives, one or more metalloid halides, one or more sources of $Cl^-$ ions and/or one or more metalloid oxides. Suitable organic additives include, but are not limited to, those having one or more sulfur atoms and one or more nitrogen atoms, such as thiourea and thiazine and/or benzotriazole (BTA). According to an exemplary embodiment, a combination of thiazine and BTA is employed. The organic additive(s) serves to aid in grain refinement, to provide more smooth and uniform plating and to increase plating efficiency. According to an exemplary embodiment, each organic additive is added to the solution at a concentration of from about 10 parts per million (ppm) to about 10,000 ppm.

Suitable metalloid halides include, but are not limited to, bismuth chloride ($BiCl_3$), titanium chloride ($TiCl_3$), antimony trichloride ($SbCl_3$) and/or arsenic trichloride ($AsCl_3$). Suitable sources of $Cl^-$ ions include, but are not limited to, hydrochloric acid (HCl), potassium chloride (KCl) and/or sodium chloride (NaCl). The metalloid halides and $Cl^-$ ion sources advantageously help to produce a brighter deposit and help to refine the grains/morphology of the deposit. According to an exemplary embodiment, each metalloid halide and/or $Cl^-$ ion source is added to the solution at a concentration of from about 10 ppm to about 10,000 ppm.

Suitable metalloid oxides include, but are not limited to, bismuth trioxide ($Bi_2O_3$), bismuth pentoxide ($Bi_2O_5$), antimony trioxide ($Sb_2O_3$), antimony pentoxide ($Sb_2O_5$), manganese dioxide ($MnO_2$) and/or manganese oxide (MnO). Metalloid oxides will inhibit hydrogen evolution during plating by increasing the hydrogen evolution over potential and thereby increasing plating efficiency. According to an exemplary embodiment, each metalloid oxide is added to the solution at a concentration of from about 10 ppm to about 10,000 ppm.

Manganese (Mn)-doped Zn films have a potential application in field emission devices (FEDs). For example, a Zn thin film can be plated with Mn as an impurity using manganese oxide as an additive in the Zn plating bath, as described above. The Mn-containing Zn film can then be annealed in a sulfur atmosphere, e.g., hydrogen sulfide ($H_2S$) gas (sulfurization) to form Mn doped ZnS. Photoluminescence measurements of a Mn-doped ZnS film produced in this manner showed that the fluorescence efficiencies increased, the glow peaks shifted to longer wavelengths, the Mn-doped ratios increased, and the doping was found responsible for the changes in the defect-related emission of the ZnS films. ZnS doped with Mn gives an orange red emission at around 590 nm. Thus, this doped film has a potential application in FEDs. Mn doped ZnS enhances photoluminescence and electroluminescence properties of the film.

The present techniques can also be used to produce Zn alloy films. The production of zinc alloy films is useful in a number of different contexts, including the production of p-type absorber layers in photovoltaic devices. Zn-containing absorber materials include, but are not limited to, CZTS. CZTS can be produced using the present techniques. To produce a Zn-alloy containing film, such as CZTS, in step 110, optionally, one or more additional metal salts may be added to the solution. Then, when plated, the film produced will contain a Zn alloy (see below).

In the context of producing a Zn alloy absorber material, by way of example only, metal salts that may be added to the solution include, but are not limited to, a copper (Cu) salt (e.g., copper sulfate ($CuSO_4$), copper chlorite ($CuClO_4$) and/or copper nitrate ($Cu(NO_3)_2$)) and/or a tin (Sn) salt (e.g., tin sulfate ($SnSO_4$), tin chlorite ($SnClO_3)_2$) and/or tin nitrate ($Sn(NO_3)_2$)). Accordingly, with these metal salt additives, binary Zn alloy films, such as copper zinc (CuZn) and zinc tin (ZnSn), and ternary alloy films, such as copper zinc tin (CuZnSn), can be plated from the solution. Each metal salt is added to the solution at a concentration of about 0.1M to about 0.5M.

Some absorber material compositions also include selenium (Se). Thus, in step 112, a Se source, such as selenium oxide, is optionally added to the solution. Any form of selenium oxide may be used. According to an exemplary embodiment, the selenium oxide is selenium dioxide ($SeO_2$), which is added to the solution, e.g., at a concentration of from about 0.01M to about 1M. By adding Se, zinc selenium (ZnSe) alloy films can be plated from the solution. Further, if the Cu and Sn salts described above are also present, then Zn alloy films such as $Cu_2ZnSnSe_4$, can be plated from the solution.

Figure 2:
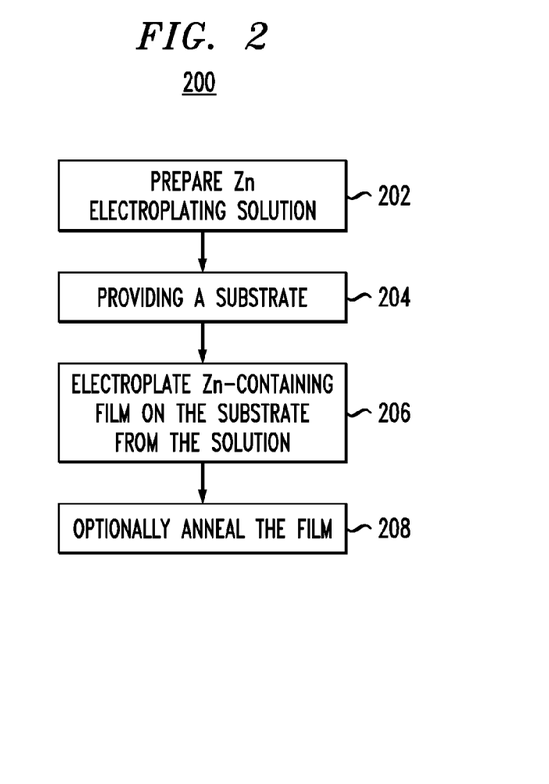
FIG. 2 is a diagram illustrating an exemplary electroplating methodology according to an embodiment of the present invention.

The solution may then be used as a plating bath to electroplate a Zn-containing film on a substrate. FIG. 2 is a diagram illustrating exemplary electroplating methodology 200. In step 202, a Zn electroplating solution is prepared. The process for preparing the Zn electroplating solution was described in conjunction with the description of FIG. 1, above, and that description is incorporated by reference herein.

In step 204, a substrate is provided. The substrate can be any substrate on which the deposition of a Zn-containing film is desired. According to an exemplary embodiment, the present techniques are employed in the formation of a Zn-containing absorber layer for a photovoltaic device, such as a CZTS absorber layer. In that instance (as will be described in detail below), the substrate can be the photovoltaic device substrate (e.g., a glass, metal or plastic substrate).

In step 206, electroplating is then used to form a Zn-containing film on the substrate using the solution as the plating bath. During the electroplating process, the substrate is placed directly in the solution (bath). Electroplating techniques, parameters and an exemplary electroplating cell which are suitable for use with the present plating solutions are described in U.S. patent application Ser. No. 12/878,746, entitled "Structure and Method of Fabricating a CZTS Photovoltaic Device by Electrodeposition" (hereinafter "U.S. patent application Ser. No. 12/878,746"), the contents of which are incorporated by reference herein. Of course, the exact composition of the film produced will depend on the composition of the electroplating solution. As described above, the electroplating solution may contain Zn alone or in combination with one or more additional metal (e.g., Cu and/or Sn) salts and/or Se. For instance, when the electroplating solution includes Zn, Cu, Sn and Se, then the film produced will contain an alloy of Zn, Cu, Sn and Se, such as $Cu_2ZnSnSe_4$.

According to an exemplary embodiment, the electroplating is carried out at room temperature, i.e., from about 18 degrees Celsius (° C.) to about 24° C. The duration of the plating can be tailored to the desired thickness of the film (see below).

Optionally, in step 208, the film is then annealed. This anneal is optional based on the intended use of the film. By way of example only, when the film is being used in the production of a photovoltaic device absorber layer conductivity is important. The anneal can help grain growth in the film by producing more crystalline, larger grains which minimizes the dislocation density (grain boundary) and hence gives better conductivity (lower resistance). According to an exemplary embodiment, the film is annealed at a temperature of from about 100° C. to about 300° C., e.g., about 150° C., for a duration of from about 30 minutes to about 60 minutes.

One notable advantage of the present techniques is that the electroplating process and Zn electroplating solutions described herein can be used to form Zn alloy films (e.g., CZTS) that can serve as the absorber layer in photovoltaic devices. An exemplary photovoltaic device and method for the fabrication thereof will now be described. It is to be understood however that there are many different possible photovoltaic device configurations, and the particular configuration described below is provided merely to illustrate the present techniques.

Figure 3:
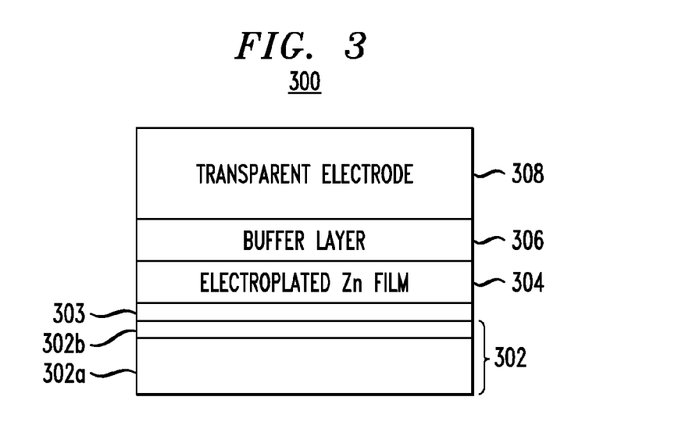
FIG. 3 is a diagram illustrating an exemplary photovoltaic device according to an embodiment of the present invention.

FIG. 3 is a diagram illustrating exemplary photovoltaic device 300. Photovoltaic device 300 includes a substrate 302, p-type absorber layer 304 adjacent to substrate 302, buffer layer 306 adjacent to a side of absorber layer 304 opposite substrate 302 and transparent electrode 308 adjacent to a side of buffer layer 306 opposite absorber layer 304. According to an exemplary embodiment, substrate 302 includes a glass, metal or plastic substrate 302a that is coated with a material 302b such as Mo. A metal layer 303 (e.g., a Cu layer) may be present between substrate 302 and absorber layer 304. A conductor layer is needed in order to electroplate the absorber layer on the substrate (see, for example, FIG. 4, described below). In this example, metal layer 303 serves this purpose. Further, metal layer 303 prevents the undesirable oxidation of the Mo. Metal layer 302 can serve as a bottom electrode for the device.

Absorber layer 304 contains a p-type semiconductor material, such as CZTS. As will be described in detail below, absorber layer 304 can be formed from a film(s) produced using the present electroplating solution and present electroplating techniques.

Buffer layer 306 includes an n-type material such as cadmium sulfide (CdS). Transparent electrode 308 includes a material such as aluminum (Al) or n-doped zinc oxide (ZnO) or indium-tin-oxide (ITO) and intrinsic ZnO.

Figure 4:
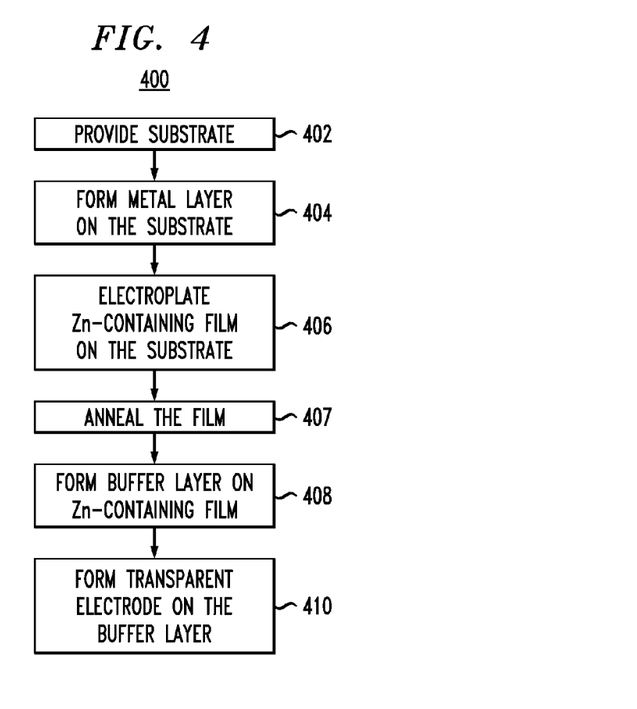
FIG. 4 is a diagram illustrating an exemplary methodology for fabricating the photovoltaic device of FIG. 3 according to an embodiment of the present invention.

FIG. 4 is a diagram illustrating exemplary methodology 400 for fabricating a photovoltaic device, such as photovoltaic device 300 (of FIG. 3). In step 402, a substrate is provided. According to an exemplary embodiment, the substrate includes a Mo-coated glass substrate. In step 404, a metal layer is formed on the substrate, i.e., on the Mo-coated surface of the glass substrate. As described above, the metal layer serves as a conductive layer for electroplating and prevents oxidation of the Mo. The metal layer will serve as a bottom electrode of the device. According to an exemplary embodiment, the metal layer includes Cu and is formed using a sputtering or evaporation technique to a thickness of from about 20 nanometers (nm) to about 100 nm, e.g., about 40 nm.

In step 406, a p-type absorber layer is formed adjacent to the substrate. Namely, the substrate (with the metal layer) is placed directly into a plating bath solution prepared as described, for example, in conjunction with the description of FIG. 1, above, and that description is incorporated by reference herein. In this case, the electroplating solution, in addition to Zn, contains one or more additional metal salts. The particular metal salt(s) used depend on the desired composition of the absorber layer. By way of example only, the electroplating solution would contain, in addition to Zn, a Cu salt and a Sn salt if a CZTS absorber layer is desired. Suitable Zn, Cu and Sn salts were provided above. Electroplating is then used to form the absorber layer (e.g., CZTS) on the substrate over the metal layer. The electroplating process was described in conjunction with the description of FIG. 2, above, and that description is incorporated by reference herein.

The plating time can be tailored to the desired thickness of the resultant Zn-containing absorber layer, with a longer plating time being used to attain a thicker layer. According to an exemplary embodiment, the Zn-containing absorber layer is formed on the substrate to a thickness of from about 1 nm to about 1 micrometer (m).

The absorber layer produced in this manner will be an alloy of Zn and the appropriate metal(s). It is also possible to plate a plurality of layers, each layer containing one or more components of the absorber layer, and then anneal the layers to intersperse the components and form the absorber layer. This technique is described in U.S. patent application Ser. No. 12/878,746. To do so may require plating layers, such as Se-containing layers. Techniques for preparing a Se plating solution for electrodepositing a Se-containing metal layer, for example, are described in U.S. patent application Ser. No. 12/878,811, entitled "Method and Chemistry for Selenium Electrodeposition," the contents of which are incorporated by reference herein.

After plating, the absorber layer can optionally be annealed, for example, at a temperature of from about 100° C. to about 300° C., e.g., about 150° C., for a duration of from about 30 minutes to about 60 minutes, to increase its conductivity, as described above. This anneal is performed in step 407.

In step 408, an n-type buffer layer is formed adjacent to a side of the absorber layer opposite the substrate. According to an exemplary embodiment, the buffer layer includes CdS and is deposited onto the Se-containing film using chemical bath deposition or a spray technique to a thickness of from about 20 nm to about 40 nm. Since the buffer layer contains an n-type material, the buffer layer will form a p-n junction with the p-type absorber layer.

In step 410, a transparent electrode is formed on the buffer layer (adjacent to a side of the buffer layer opposite the absorber layer). According to an exemplary embodiment, the transparent electrode includes Al or n-doped ZnO or a combination of ITO and intrinsic ZnO and is deposited onto the buffer layer using a sputtering technique to a thickness of from about 250 nm to about 350 nm.

Figure 5:
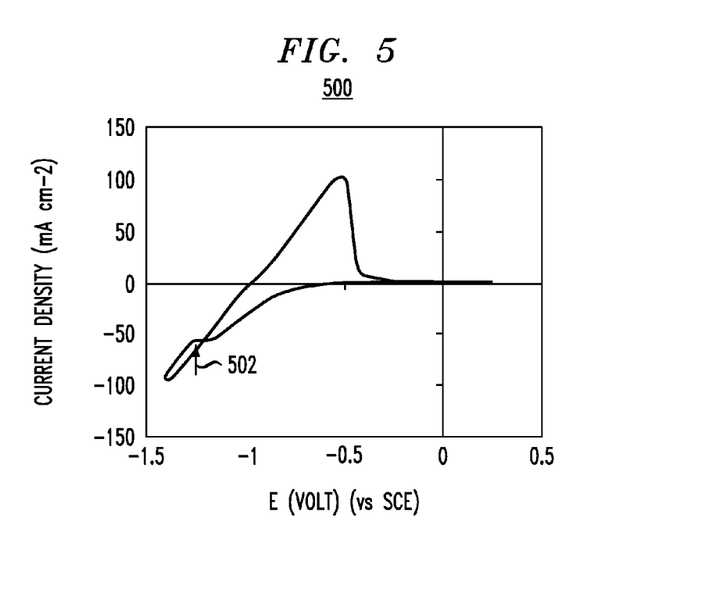
FIG. 5 is a cyclic voltammogram illustrating electrochemical properties of a Zn sulfate solution in methanesulfonic acid (MSA) according to an embodiment of the present invention.

The present techniques are further described by way of reference to the following non-limiting examples. FIG. 5 is a cyclic voltammogram 500 illustrating electrochemical properties of a Zn sulfate solution in MSA. Cyclic voltammetry (CV) is known to those of skill in the art and thus is not described further herein. In voltammogram 500, electrode voltage (E) (measured in volts (V)) vs. saturated calomel reference electrode (SCE) is plotted on the x-axis and current density (measured in milliamps per square centimeter ($mAcm^{-2}$)) is plotted on the y-axis. The onset of hydrogen evolution is indicated by arrow 502.

Figure 6:
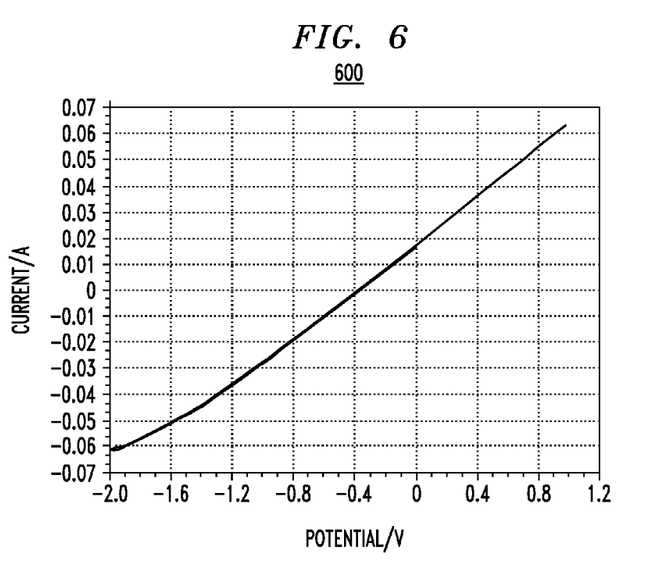
FIG. 6 is a cyclic voltammogram illustrating electrochemical properties of a Zn solution with adjusted pH of 2.0 according to an embodiment of the present invention.

FIG. 6 is a cyclic voltammogram 600 illustrating electrochemical properties of a 0.25M Zn in 0.5M MSA and 0.5M NaOH solution with adjusted pH of 2.0 (e.g., using additional MSA). In voltammogram 600, potential (measured in V) is plotted on the x-axis and current (measured in amps (A)) is plotted on the y-axis. There is no hydrogen evolution in this potential window. The total charge density for reduction $Q_{red}$ is equal to the oxidation $Q_{oxd}$ and thus plating efficiency is approximately 100 percent (%). Therefore, the system is completely reversible. Since the reduction (plating) and oxidation (striping) is completely reversible, this Zn system can be used for battery systems, see below. It is notable that voltammogram 600 is for one cycle, however even tests done with 10 cycles and up to as many as 100 cycles show that the system remains completely reversible.

Figure 7:
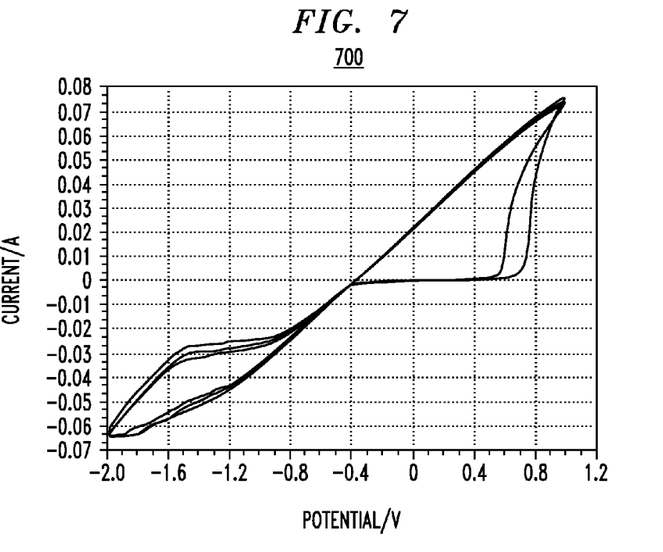
FIG. 7 is a cyclic voltammogram illustrating electrochemical properties of a Zn solution with adjusted pH of 2.0 and added thiourea according to an embodiment of the present invention.

FIG. 7 is a cyclic voltammogram 700 illustrating electrochemical properties of a 0.25M Zn in 0.5M MSA and 0.5M NaOH solution with adjusted pH of 2.0 with MSA and added 1,000 ppm thiourea. In voltammogram 700, potential (measured in V) is plotted on the x-axis and current (measured in A) is plotted on the y-axis.

Figure 8:
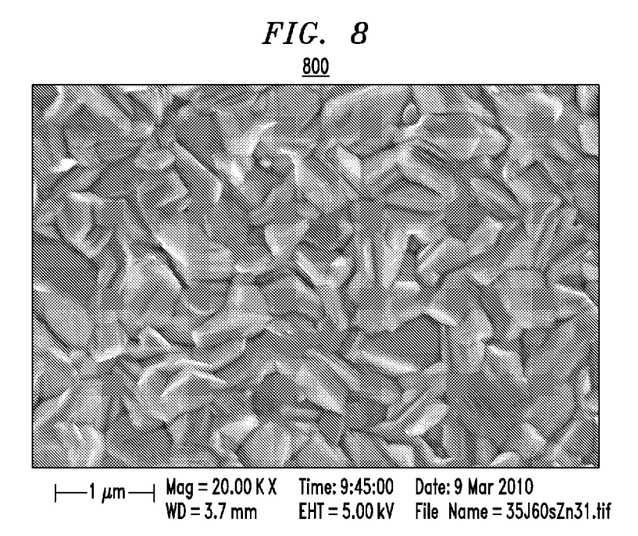
FIG. 8 is an image of a microstructure of an electroplated Zn thin film which was plated from an MSA based solution without additives according to an embodiment of the present invention.

FIG. 8 is an image 800 of a microstructure of an electroplated Zn thin film which was plated from an MSA based solution without additives at 35 mAcm$^{-2}$ at 550 revolutions per minute (rpm). Specifically, the solution contained Zn sulfate in MSA (pH adjusted to 2.0) with NaOH treatment. A very uniform and homogenous microstructure was observed over the surface. The film contained an average grain size ranging from 500 nm to about 750 nm and has few twin boundaries. Crystal twinning occurs when two separate crystals share some of the same crystal lattice points in a symmetrical manner. The result is an intergrowth of two separate crystals in a variety of specific configurations. A twin boundary or composition surface separates the two crystals.

Figure 9:
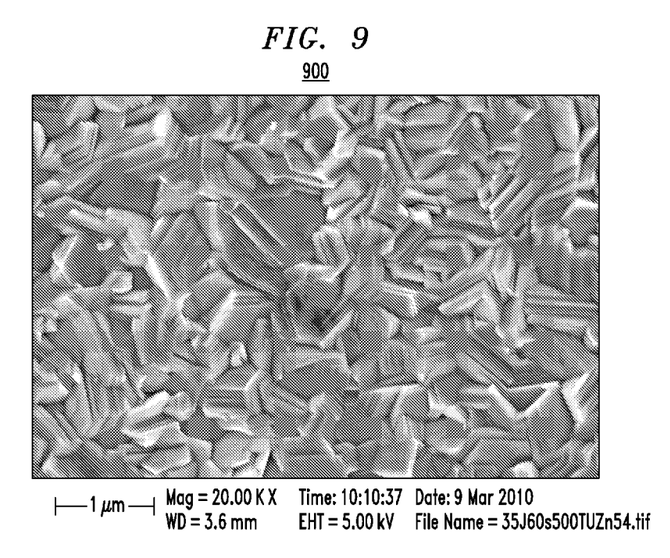
FIG. 9 is an image of a microstructure of an electroplated Zn thin film which was plated from an MSA based solution with a thiourea additive according to an embodiment of the present invention.

FIG. 9 is an image 900 of a microstructure of an electroplated Zn thin film which was plated from an MSA based solution with a thiourea additive at 35 mAcm$^{-2}$ at 550 rpm. Specifically, the solution contained Zn sulfate in MSA (pH adjusted to 2.0) with NaOH treatment and thiourea. A very uniform and homogenous, well-faceted microstructure was observed over the surface. Well-faceted grains means that the grains are very crystalline and in some instances exhibit a preferential growth to a single phase. For example, the samples plated with thiourea (FIG. 9) give (002) preferential orientation in contrast with samples plated without thiourea (see peak with $ sign in FIGS. 10 and 11, described below). The film contained an average grain size ranging from 450 nm to about 1,000 nm.

There was no significant change observed when deposition current density was increased from 20 mAcm$^{-2}$ (not shown in the figures) to 35 mAcm$^{-2}$ except somewhat smaller grains and twin boundaries at 35 mAcm$^{-2}$. However, when thiourea (500 ppm) was added, a significant microstructural change was observed. A very well-faceted small grain microstructure was obtained (see, for example, FIG. 9, described above) which gives high intensity of (002) phase in the x-ray diffraction (XRD) spectrum. This result suggests that thiourea helps to grow crystals/grains with a certain crystallographic orientation. According to the XRD spectrum (see for example FIGS. 10 and 11), plating of Zn thin films with the addition of thiourea in MSA after quenching with NaOH based baths gives a predominately (002) crystal orientation which is most likely normal to the surface of the substrate.

Figure 10:
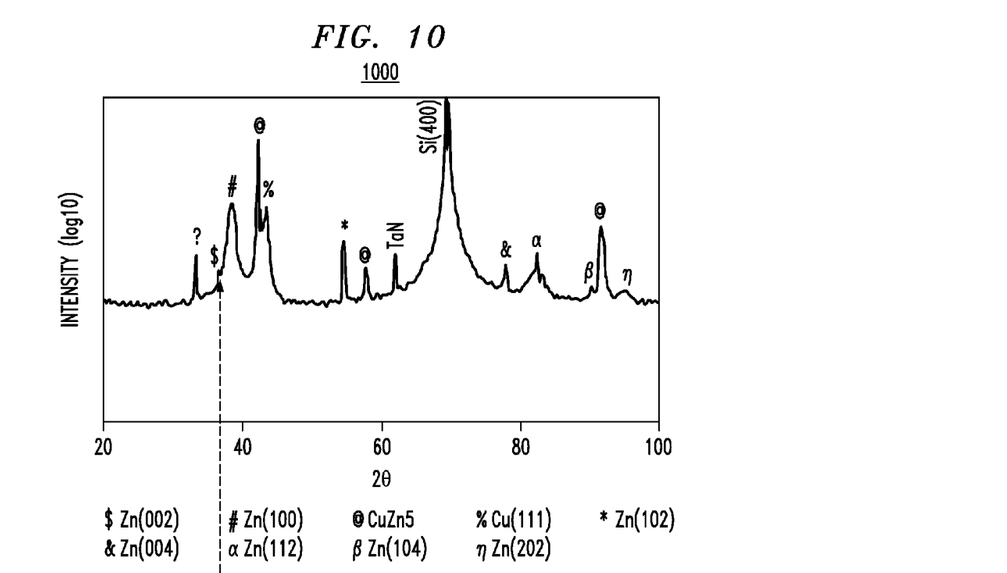
FIG. 10 is an x-ray diffraction (XRD) spectrum of a Zn film electroplated from a Zn sulfate solution in MSA after sodium hydroxide (NaOH) treatment without any additives according to an embodiment of the present invention.

FIG. 10 is an XRD spectrum 1000 of a Zn film electroplated from a Zn sulfate solution in MSA (pH adjusted to 2.0) after NaOH treatment without any additives. A deposition current density of 35 mAcm$^{-2}$ was employed. In XRD spectrum 1000, beam angle (2θ) is plotted on the x-axis and intensity is plotted on the y-axis. The peak marked with (?) does not match with any Joint Committee on Powder Diffraction (JCPDS) data. But that peak is very close to ZnO (002). When films are plated with thiourea, formation of ZnO is prevented. Repeated experiments show that this peak is always there when Zn is being plated without thiourea. As plated without thiourea always gives very low or no intensity for Zn(002)=$. A key to the diffraction peaks is provided to the left of XRD spectrum 1000.

Figure 11:
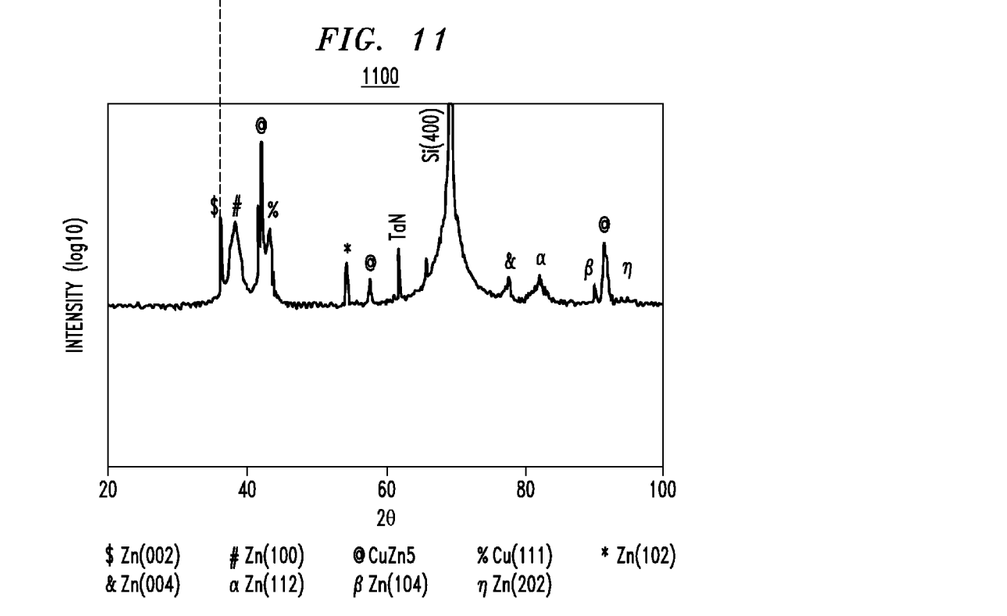
FIG. 11 is a XRD spectrum of a Zn film electroplated from a Zn sulfate solution in MSA after NaOH treatment with thiourea as an additive according to an embodiment of the present invention.

FIG. 11 is a XRD spectrum 1100 of a Zn film electroplated from a Zn sulfate solution in MSA (pH adjusted to 2.0) after NaOH treatment with thiourea as an additive. A deposition current density of 35 mAcm$^{-2}$ was employed. In XRD spectrum 1100, beam angle (2θ) is plotted on the x-axis and intensity is plotted on the y-axis. Zn films plated with thiourea predominately show a high intensity peak for Zn(002)=$ and very low or no intensity for Zn (202). A key to the diffraction peaks is provided to the left of XRD spectrum 1100.

Figure 12:
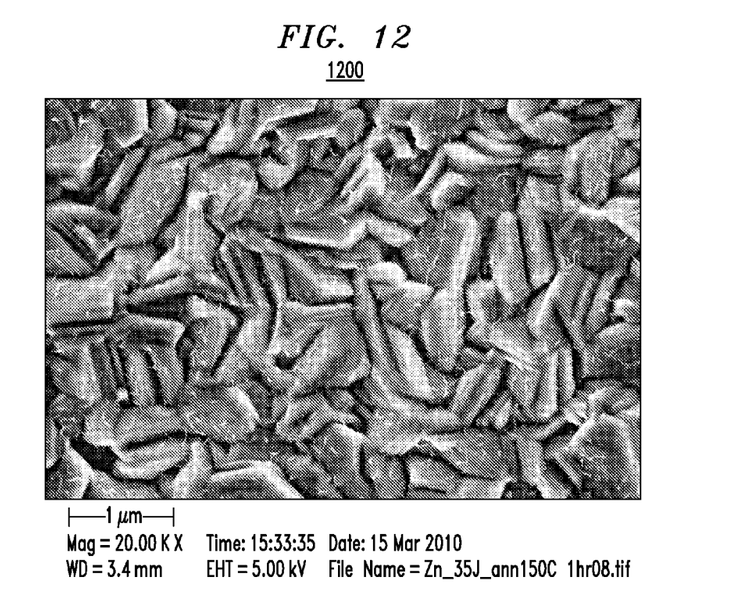
FIG. 12 is an image of a microstructure of an electroplated Zn thin film plated from an MSA based solution without any additive, after an anneal according to an embodiment of the present invention.

FIG. 12 is an image 1200 of a microstructure of an electroplated Zn thin film which was plated from an MSA based solution without any additive after an anneal at 150° C. for 1 hour. The solution in this example was prepared according to the techniques presented above, and contained Zn sulfate in MSA (pH adjusted to 2.0) with NaOH treatment.

Figure 13:
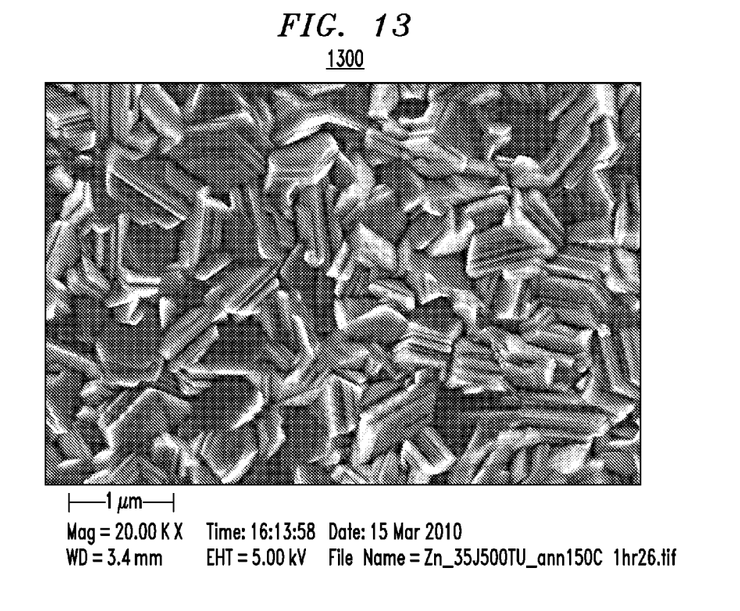
FIG. 13 is an image of a microstructure of an electroplated Zn thin film plated from an MSA based solution with a thiourea additive, after an anneal according to an embodiment of FIG. 14 is a XRD spectrum of a Zn film electroplated from a Zn sulfate solution in MSA after NaOH treatment, without any additives, after an anneal according to an embodiment of the present invention.

FIG. 13 is an image 1300 of a microstructure of an electroplated Zn thin film which was plated from an MSA based solution with a thiourea additive after an anneal at 150° C. for 1 hour. The solution in this example was prepared according to the techniques presented above, and contained Zn sulfate in MSA (pH adjusted to 2.0) with NaOH treatment and thiourea.

Figure 14:
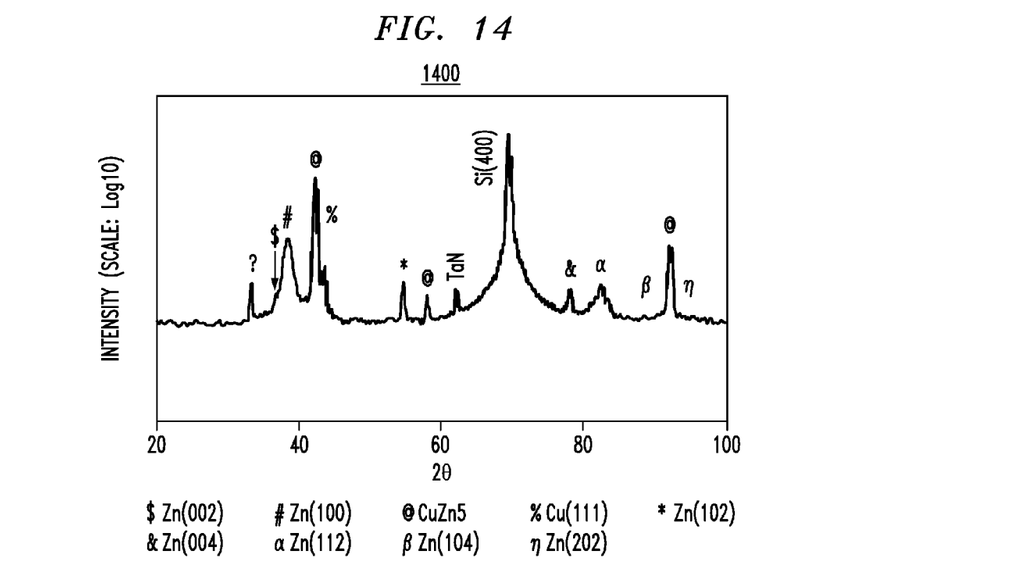

FIG. 14 is a XRD spectrum 1400 of a Zn film electroplated from a Zn sulfate solution in MSA (pH adjusted to 2.0) after NaOH treatment without any additives after an anneal at 150° C. for 1 hour. A deposition current density of 35 mAcm$^{-2}$ was employed. In XRD spectrum 1400, beam angle (2θ) is plotted on the x-axis and intensity is plotted on the y-axis. A key to the diffraction peaks is provided to the left of XRD spectrum 1400.

Figure 15:
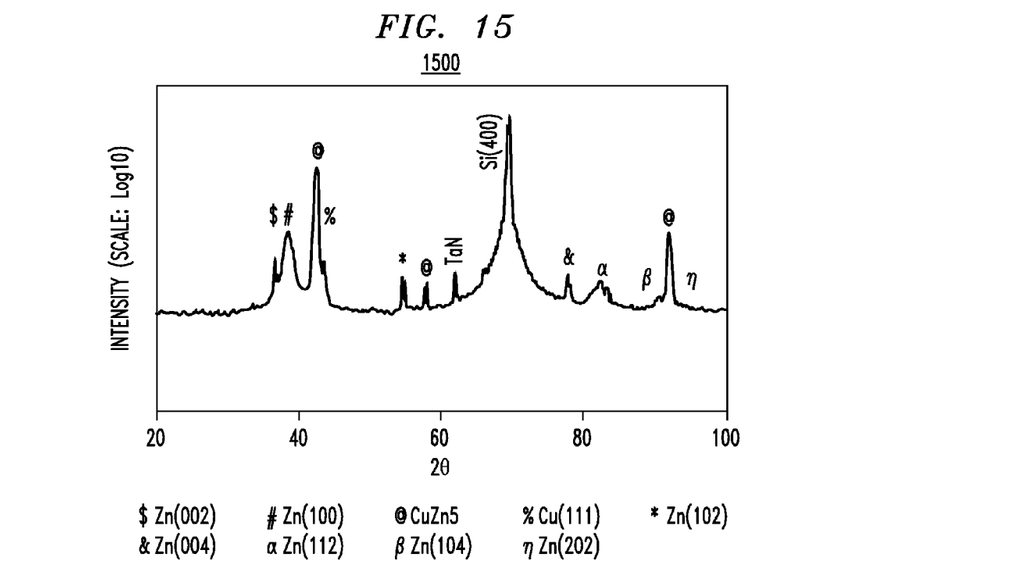
FIG. 15 is a XRD spectrum of a Zn film electroplated from a Zn sulfate solution in MSA after NaOH treatment, with thiourea as an additive, after an anneal according to an embodiment of the present invention.

FIG. 15 is a XRD spectrum 1500 of a Zn film electroplated from a Zn sulfate solution in MSA (pH adjusted to 2.0) after NaOH treatment with thiourea as an additive after an anneal at 150° C. for 1 hour. A deposition current density of 35 mAcm$^{-2}$ was employed. In XRD spectrum 1500, beam angle (2θ) is plotted on the x-axis and intensity is plotted on the y-axis. A key to the diffraction peaks is provided to the left of XRD spectrum 1500.

Figure 16A:
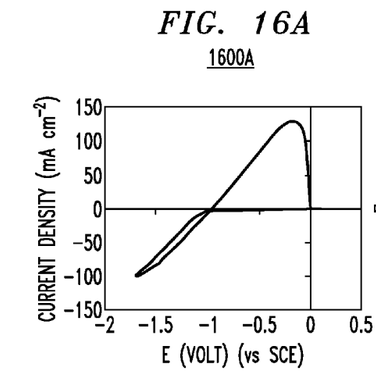
FIG. 16A is a cyclic voltammogram illustrating electrochemical properties of a Zn sulfate solution in MSA after NaOH treatment, having a thiourea additive according to an embodiment of the present invention.
Figure 16B:
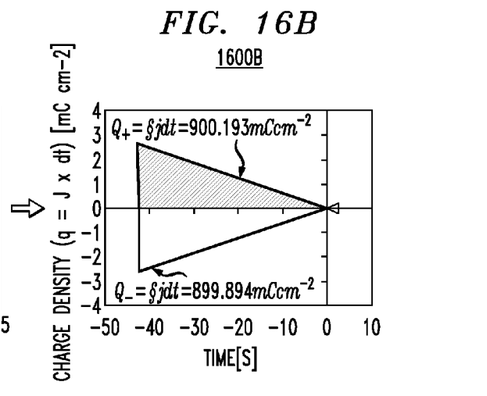
FIG. 16B is a replotting of the graph of FIG. 16A to illustrate plating efficiency according to an embodiment of the present invention.

FIGS. 16A and 16B are graphs 1600A and 1600B, respectively, illustrating plating efficiency. Specifically, FIG. 16A is a cyclic voltammogram 1600A illustrating electrochemical properties of a Zn sulfate solution in MSA (pH adjusted to 2.0) after NaOH treatment (thiourea additive). In voltammogram 1600A, electrode voltage (E) (measured in V) vs. SCE is plotted on the x-axis and current density (measured in mAcm$^{-2}$) is plotted on the y-axis. Voltammogram 1600A is replotted as graph 1600B, with time (measured in seconds (s)) plotted on the x-axis and charge density q=Jxdt (measured in millicoulombs per square centimeter (mC cm$^{-2}$)) plotted on the y-axis, by integrating total charge density $Q_+$=+900.193 mCcm$^{-2}$ and $Q_-$=−899.894 mCcm$^{-2}$ found to be equal. The calculation shows that the reduction charge density is equal to the oxidation charge density and therefore the system is reversible. Plating efficiency is 100% and there is no hydrogen evolution in this potential window. The same solution, without thiourea (not shown) also has a 100% plating efficiency. Thus, the present solutions may be useful for fabricating reversible Zn batteries wherein the Zn will be oxidized and reduced in repeated cycles. According to Coulombs law, $d=qv_m/nF$, wherein d is thickness, q is charge density, $V_m=9.1568$ C cm$_{-2}$ is molar volume and F is faraday's constant. Using this law, the calculated thickness of Zn films should be equal to 426.95 nm.

Figure 17:
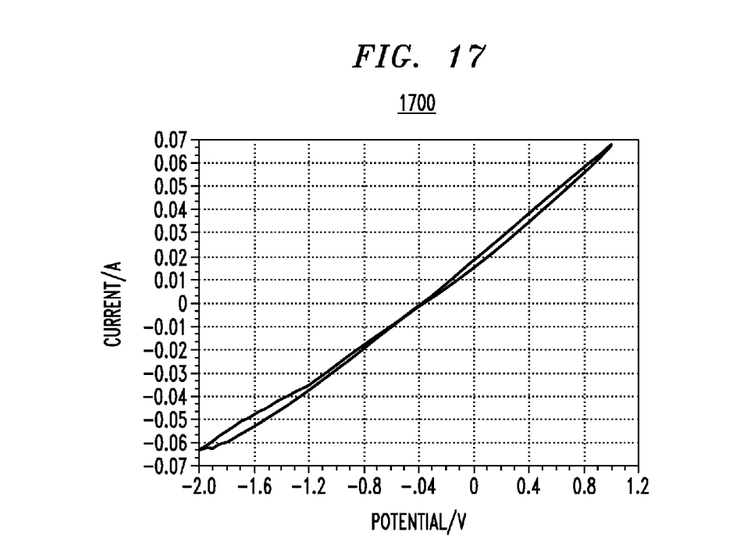
FIG. 17 is a cyclic voltammogram illustrating electrochemical properties of a Zn solution with adjusted pH of 2.0 and bismuth chloride ($BiCl_3$) according to an embodiment of the present invention.

FIG. 17 is a cyclic voltammogram 1700 illustrating electrochemical properties of a 0.25M Zn in 0.5M MSA and 0.5M NaOH solution with adjusted pH of 2.0 (e.g., using additional MSA) and 1,000 ppm BiCl$_3$. In voltammogram 1700, potential (measured in V) is plotted on the x-axis and current (measured in A) is plotted on the y-axis.

Figure 18A:
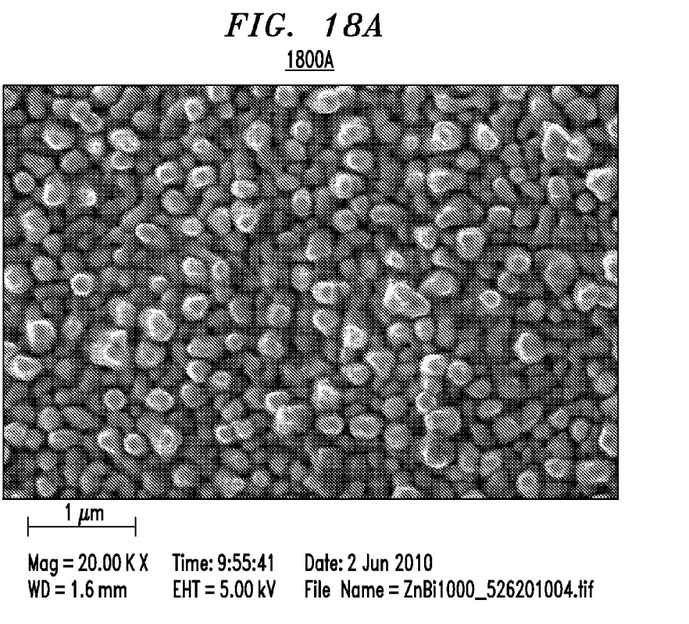
FIG. 18A is a top-down image illustrating the effect of bismuth (Bi) on surface morphology of a film produced using galvanostatic deposition from a Zn solution with adjusted pH of 2.0 and $BiCl_3$ according to an embodiment of the present invention.
Figure 18B:
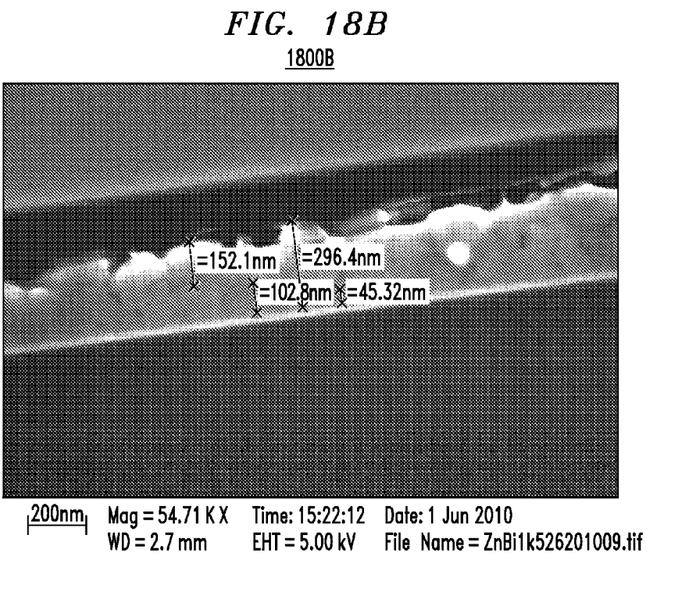
FIG. 18B is a cross-sectional image illustrating effect of Bi on surface morphology of a film produced using galvanostatic deposition from a Zn solution with adjusted pH of 2.0 and $BiCl_3$ according to an embodiment of the present invention.

FIGS. 18A and 18B are images 1800A and 1800B, respectively, of the effect of bismuth (Bi) on surface morphology of a film produced using galvanostatic deposition at 15 mAcm$^{-2}$ from a 0.25M Zn in 0.5M MSA and 0.5M NaOH solution with adjusted pH of 2.0 (e.g., using additional MSA) and 1,000 ppm BiCl$_3$. From the top-down topography image (image 1800A) and the cross-sectional image (image 1800B), it is clear that with the addition of BiCl$_3$ the morphology/grain structure of the plated Zn is very different from the results without a Bi additive, such as those exemplary formulations described above. Specifically, the BiCl$_3$ refines the grain structure and gives smaller grains.

Figure 19:
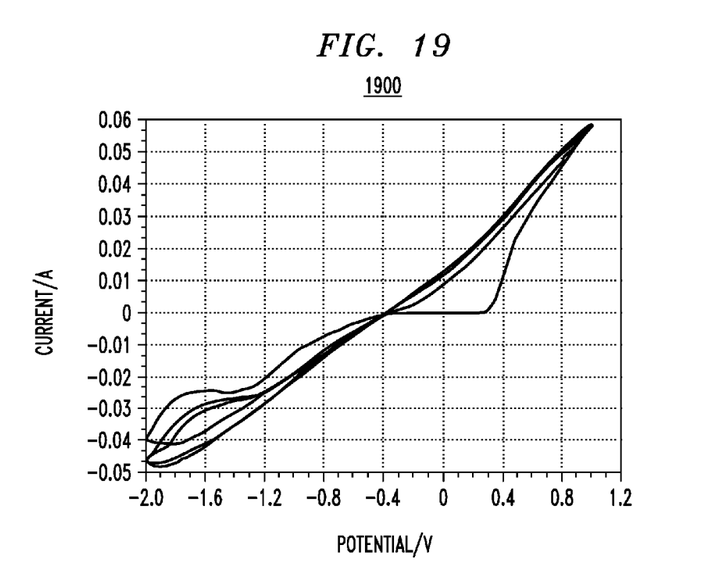
FIG. 19 is a cyclic voltammogram illustrating electrochemical properties of a Zn solution with adjusted pH of 2.0 and added thiourea, $BiCl_3$ and Benzotriazole (BTA) according to an embodiment of the present invention.

FIG. 19 is a cyclic voltammogram 1900 illustrating electrochemical properties of a 0.25M Zn in 0.5M MSA and 0.5M NaOH solution with adjusted pH of 2.0 (e.g., using additional MSA) and added thiourea, BiCl$_3$ and BTA at 1,000 ppm each. In voltammogram 1900, potential (measured in V) is plotted on the x-axis and current (measured in A) is plotted on the y-axis.

Figure 20:
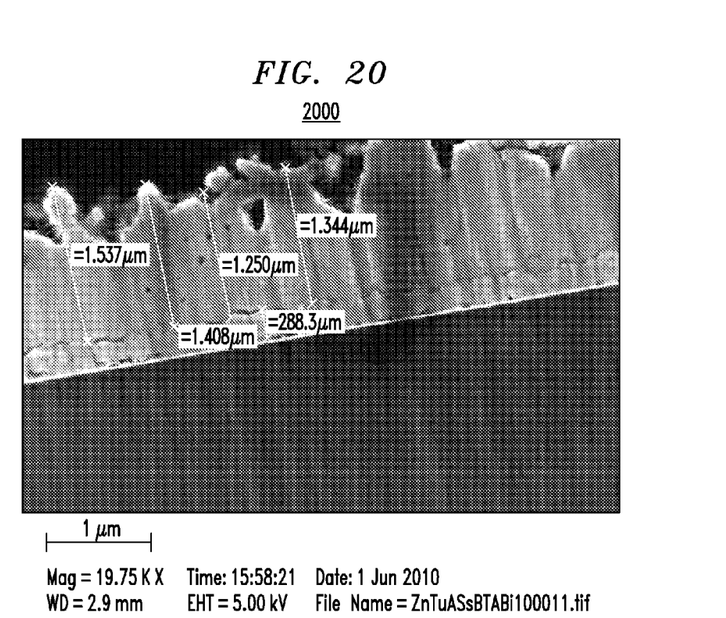
FIG. 20 is an image of the effect of Bi, BTA and thiourea on surface morphology of a film produced using galvanostatic deposition from a Zn solution with adjusted pH of 2.0 and added thiourea, $BiCl_3$ and BTA according to an embodiment of the present invention.

FIG. 20 is a cross-sectional image 2000 illustrating the effect of Bi, BTA and thiourea on surface morphology of a film produced using galvanostatic deposition at 15 mAcm$^{-2}$ from a 0.25M Zn in 0.5M MSA and 0.5M NaOH solution with adjusted pH of 2.0 (e.g., using additional MSA) and added thiourea, BiCl$_3$ and BTA at 1,000 ppm each. From the image 2000 it is clear that the Zn is deposited nicely with uniform and compact layers, and as thickness increases the deposited surface becomes rough. The present Zn chemistry permits the plating of thin uniform layers of Zn. With thin uniform layers, the surfaces of the layers would not be rough. However, when thicker layers (e.g., 1,400 nm thick) are being plated with a high plating rate (due to the acceleration effect of the additive), the high plating rate might cause an extended depletion layer through which ions migrate by diffusion. Surface roughness may then be generated after the growth of a critical thickness beyond which the large depletion layer develops. A rough surface is generally undesired for most applications (e.g., it is undesirable for photovoltaic devices). This effect can, however, be avoided by improving agitation, increasing the concentration of ions, and/or by stopping the plating before the layer reaches the critical thickness beyond which surface roughness develops. In this example, the expected thickness was 712 nm. The acquired thickness was 1,400 nm and the deposition rate was 14 nm per second (nms$^{-1}$). Therefore, the combination of the additives (thiourea, BiCl$_3$ and BTA) accelerated the plating efficiency to double.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of preparing a zinc electroplating solution, comprising the steps of:
    forming the solution from a copper-free mixture comprising at least one zinc salt, a sulfonic acid and a solvent such that, initially, a pH of the solution is from about 0 to about 0.1, wherein the solution is formed by adding the sulfonic acid to a combination of the at least one zinc salt and the solvent, and stirring the solution until the at least one zinc salt dissolves as is indicated by the solution becoming colorless;
    after the at least one zinc salt has dissolved, quenching the sulfonic acid with a first base comprising sodium hydroxide to bring the pH of the solution to from about 6.5 to about 7.5, wherein by way of the quenching step a zinc precipitate is formed in the solution as is indicated by the solution becoming opaque, and wherein the first base is used only to bring the pH of the solution to from about 6.5 to about 7.5 and to form the zinc precipitate;
    after the quenching step has been performed and the zinc precipitate has been formed, switching to a second base and using the second base for adjusting the pH of the solution to be greater than about 8.0 at which point the solution becomes clear,
    wherein by way of the quenching step and subsequent adjusting step, the sulfonic acid forms a complex with zinc ions from the at least one zinc salt; and
    adding at least one metalloid oxide to the solution, wherein the at least one metalloid oxide comprises one or more of manganese dioxide and manganese oxide.

2. The method of claim 1, wherein the second base is a combination of sodium hydroxide and potassium hydroxide.

3. The method of claim 1, further comprising the step of: adding at least one metalloid halide to the solution.

4. The method of claim 3, wherein the at least one metalloid halide comprises one or more of bismuth chloride, titanium chloride, antimony trichloride and arsenic trichloride.

5. The method of claim 1, further comprising the step of: adding at least one source of Cl$^-$ ions to the solution.

6. The method of claim 5, wherein the at least one source of Cl$^{-1}$ ions comprises one or more of hydrochloric acid, potassium chloride and sodium chloride.

7. The method of claim 1, further comprising the step of: adding at least one organic additive to the solution.

8. The method of claim 7, wherein the at least one organic additive has one or more sulfur atoms and one or more nitrogen atoms.

9. The method of claim 8, wherein the organic additive is selected from the group consisting of thiourea and thiazine.

10. The method of claim 7, wherein the organic additive comprises benzotriazole.

11. The method of claim 1, wherein the at least one zinc salt comprises one or more of zinc chloride, zinc nitrate and zinc sulfate.

12. The method of claim 1, further comprising the step of: adding at least one additional metal salt to the solution.

13. The method of claim 12, wherein the additional metal salt comprises a tin salt such that the solution is configured to plate a binary zinc alloy film consisting of zinc and tin.

14. The method of claim 13, wherein the tin salt comprises one or more of tin sulfate, tin chlorite and tin nitrate.

15. The method of claim 1, further comprising the step of: adding selenium oxide to the solution.

16. The method of claim 1, wherein the solvent is water.

* * * * *